United States Patent
Shoki

(10) Patent No.: US 8,367,279 B2
(45) Date of Patent: Feb. 5, 2013

(54) REFLECTIVE MASK BLANK, REFLECTIVE MASK, AND METHOD OF MANUFACTURING THE SAME

(75) Inventor: Tsutomu Shoki, Tokyo (JP)

(73) Assignee: Hoya Corporation, Tokyo (JP)

( * ) Notice: Subject to any disclaimer, the term of this patent is extended or adjusted under 35 U.S.C. 154(b) by 80 days.

(21) Appl. No.: 12/935,695

(22) PCT Filed: Mar. 24, 2009

(86) PCT No.: PCT/JP2009/055859
§ 371 (c)(1),
(2), (4) Date: Sep. 30, 2010

(87) PCT Pub. No.: WO2009/122972
PCT Pub. Date: Oct. 8, 2009

(65) Prior Publication Data
US 2011/0027703 A1    Feb. 3, 2011

(30) Foreign Application Priority Data
Mar. 31, 2008  (JP) ................................. 2008-093655

(51) Int. Cl.
G03F 1/24    (2012.01)
G03F 1/26    (2012.01)

(52) U.S. Cl. .......................................................... 430/5

(58) Field of Classification Search ................ 430/5, 30; 378/35
See application file for complete search history.

(56) References Cited

U.S. PATENT DOCUMENTS

2006/0099517 A1 * 5/2006 Sugawara ........................ 430/5
2009/0111032 A1 * 4/2009 Woo ................................ 430/5

FOREIGN PATENT DOCUMENTS

| JP | 62-50811 A   | 4/1982  |
|----|--------------|---------|
| JP | 6-282063 A   | 10/1994 |
| JP | 8-213303 A   | 8/1996  |
| JP | 2003-338461 A| 11/2003 |
| JP | 2004-96063 A | 3/2004  |
| JP | 2004-207593 A| 7/2004  |
| JP | 2006-190900 A| 7/2006  |

* cited by examiner

*Primary Examiner* — Stephen Rosasco
(74) *Attorney, Agent, or Firm* — Sughrue Mion, PLLC

(57) ABSTRACT

A reflective mask blank includes a substrate, a multilayer reflective film formed on the substrate and having a structure in which a high refractive index layer and a low refractive index layer are alternately laminated, and an absorbing film stacked on the multilayer reflective film and adapted to absorb EUV exposure light. The absorbing film includes a phase shift layer adapted to give a predetermined phase difference to the EUV exposure light having passed therethrough and reflected by the multilayer reflective film with respect to the EUV exposure light directly incident on and reflected by the multilayer reflective film, and an absorber layer stacked on the phase shift layer and adapted to absorb and attenuate the EUV exposure light passing therethrough, either alone or jointly with the phase shift layer.

23 Claims, 4 Drawing Sheets

REFLECTIVE MASK BLANK, REFLECTIVE MASK, AND METHOD OF MANUFACTURING THE SAME

TECHNICAL FIELD

This invention relates to a reflective mask blank and a reflective mask. More specifically, this invention relates to a reflective mask blank suitable for a reflective mask for use in a lithography method using exposure light in a short wavelength region such as extreme ultraviolet light and to a reflective mask formed using such a reflective mask blank.

BACKGROUND ART

In recent years, with higher integration of semiconductor devices, fine patterns exceeding the transfer limit of a photolithography method using the conventional ultraviolet light have been required in the semiconductor industry. In order to enable transfer of such fine patterns, the EUV lithography being an exposure technique using extreme ultraviolet light (hereinafter referred to as EUV light) with a shorter wavelength is expected to be promising. Herein, the EUV light represents light in a wavelength band of the soft X-ray region or the vacuum ultraviolet region and, specifically, light having a wavelength of about 0.2 to 100 nm. As an exposure mask for use in the EUV lithography, there is proposed a reflective mask as described in JP-A-H8-213303 (Patent Document 1).

This reflective mask has a structure in which a multilayer reflective film for reflecting the EUV light serving as exposure light is formed on a substrate and, further, an absorber film for absorbing the EUV light is formed in a pattern on the multilayer reflective film. When pattern transfer is carried out using an exposure apparatus (pattern transfer apparatus) with the reflective mask disposed therein, the exposure light incident on the reflective mask is absorbed at a portion where the absorber film pattern is present, but is reflected by the multilayer reflective film at a portion where the absorber film pattern is not present so that the reflected light is transferred onto, for example, a semiconductor substrate (resist-coated silicon wafer) through a reflective optical system.

Apart from the reduction in wavelength of light, a resolution improvement technique using a phase shift mask is proposed by Levenson et al. of IBM (e.g. JP-B-S62-50811 (Patent Document 2)). In the phase shift mask, a transmitting portion of a mask pattern is made of a substance or has a shape which is different from that of its adjacent transmitting portion so that a phase difference of 180 degrees is given to lights transmitted therethrough. Therefore, in an area between both transmitting portions, the transmitted diffracted lights different in phase by 180 degrees cancel each other out and thus the light intensity becomes extremely small to improve the mask contrast. As a result, the depth of focus upon transfer increases to improve the transfer accuracy. The phase difference is theoretically best at 180 degrees, but if it is substantially about 175 to 185 degrees, a resolution improvement effect is obtained.

A halftone mask which is one type of a phase shift mask is a phase shift mask that improves the resolution of a pattern edge portion by using a light-absorbing thin film as a material of a mask pattern to give a phase difference of 180 degrees with respect to normal light transmitted through a substrate while reducing the transmittance to about several % (normally about 5 to 20%). As a light source, it is currently shifting from a KrF excimer laser (wavelength 248 nm) hitherto used to an ArF excimer laser (wavelength 193 nm).

However, even with the ArF excimer laser, also in terms of problems in exposure apparatus and resist, it is not easy to apply it as a futuristic lithography technique for manufacturing a device with a line width of 50 nm or less.

In view of this, in order to further improve the transfer resolution of the EUV lithography, there is proposed an EUV exposure mask that makes it possible to apply the theory of a halftone mask used in conventional excimer laser exposure or the like to the EUV lithography using a reflective optical system (e.g. JP-A-2004-207593 (Patent Document 3)).

Patent Document 1: JP-A-H8-213303
Patent Document 2: JP-B-S62-50811
Patent Document 3: JP-A-2004-207593

DISCLOSURE OF THE INVENTION

Problem to be Solved by the Invention

Hereinbelow, a related EUV exposure mask will be described with reference to FIGS. 6A and 6B. FIG. 6A is a cross-sectional view and a plan view of the related EUV exposure mask.

As shown in FIG. 6A, the related EUV exposure mask is such that a multilayer film 111 adapted to serve as a high-reflection area for exposure light is formed on a substrate 110 and a pattern of a low-reflection layer 112 adapted to serve as a low-reflection area is formed on the multilayer film 111. The low-reflection layer 112 is in the form of a two-layer film and is characterized in that assuming that, at the exposure wavelength, the reflectance when the exposure light is directly incident on the multilayer film 111 is given as a reference, the reflectance when the exposure light passes through the low-reflection layer 112 to be incident on the multilayer film 111 is 5 to 20% and that the phase difference between reflected light from the low-reflection layer 112 and reflected light from the multilayer film 111 is 175 to 185 degrees.

The EUV exposure mask with such a structure makes it possible to apply the theory of the halftone mask used in the conventional excimer laser exposure or the like to the EUV exposure and the reflective optical system and thus to realize an EUV exposure mask with the transfer resolution improved by the EUV exposure and the halftone effect.

Generally, in the manufacture of semiconductor devices, exposure is carried out a plurality of times on a single transfer target formed with a resist film, using the same photomask while shifting the position, thereby transferring the same pattern a plurality of times to the single transfer target.

Primarily, it is ideal that exposure light irradiated from a light source in an exposure apparatus is incident only on a portion (hereinafter referred to as a transfer area 114), where a pattern 113 to be transferred is formed, of a photomask surface, and this is contrived by adjustment with an optical system in the exposure apparatus. However, due to light diffraction phenomenon, positional accuracy, or the like, it is not possible to avoid a phenomenon in which part of the exposure light leaks (this will be referred to as leakage light) to be incident even on the periphery of the transfer area 114 (hereinafter, this peripheral area exposed to the leakage light will be referred to as a leakage light area 116). As a result, as shown in FIG. 6A, the area including not only the transfer area 114 but also the leakage light area 116 is transferred to a resist film of a transfer target.

Generally, when transferring the transfer pattern 113 of the photomask a plurality of times to a resist film formed on a transfer target (wafer or the like) using the exposure apparatus, the transfer pattern 113 of the transfer area 114 is transferred on the transfer target with almost no gap from each other as shown in FIG. 6B in order to utilize the transfer target most effectively (see transfer patterns 113A, 113B, 113C, 113D, etc. in FIG. 6B).

In this event, for example, when transferring the transfer pattern 113B with almost no gap after transfer of the transfer pattern 113A, a leakage light area 116B of the transfer pattern 113B overlaps part of the transfer pattern 113A. Further, a leakage light area 116A of the transfer pattern 113A overlaps part of the transfer pattern 113B.

In the case of a reflective mask of the type that EUV exposure light is absorbed by an absorber film 112, even if the EUV exposure light leaks to a leakage light area 116, the absorber film 112 absorbs the EUV exposure light so that there is no occurrence of reflected light, having an intensity strong enough to sensitize a resist film on a transfer target, from the absorber film 112 in the leakage light area 116 and, therefore, no particular problem arises. On the other hand, in the case of a halftone mask for use in excimer laser exposure, it is general that a light-shielding band is provided in a blind area 115 being a peripheral area around a transfer area 114 and including a leakage light area 116, thereby not affecting adjacent patterns during exposure.

However, in the case of the EUV exposure mask using the halftone effect, since the absorber film transmits EUV exposure light at a predetermined transmittance, reflected light from the leakage light area 116 also occurs. As a result, there is a problem that if the transfer pattern 113 and the leakage light area 116 overlap each other on the transfer target, the resist film on the transfer target is unintentionally sensitized.

Hereinbelow, a description will be given in detail with reference to FIG. 6B.

As described before, when transferring the transfer pattern 113 of the photomask a plurality of times to the resist film on the transfer target using the exposure apparatus, exposure is sequentially carried out such that, for example, the transfer pattern 113A is transferred to the transfer target by first exposure, the transfer pattern 113B is transferred by second exposure, the transfer pattern 113C is transferred by third exposure, and the transfer pattern 113D is transferred by fourth exposure, followed by subsequent exposure. In this case, due to overlapping between a low-reflection portion (portion that does not serve to sensitize the resist film on the transfer target) being a portion where the absorber film 112 of the transfer pattern remains and the leakage light area 116 of a portion where the absorber film 112 remains, a portion 120 subjected to overlapping of twice exposure, a portion 121 subjected to overlapping of three-times exposure, and a portion 122 subjected to overlapping of four-times exposure are formed on the resist film on the transfer target.

Normally, in the case of a reflective mask for EUV exposure, even when EUV light is directly incident on and reflected by a multilayer reflective film, the reflectance is about 70% and, therefore, the light quantity or the like of an EUV light source is adjusted so that a resist film on a transfer target can be sensitized with the quantity of this 70% reflected light. For example, in the case of using a reflective mask having a reflectance of about 20% when EUV light is reflected by a multilayer reflective film 111 through an absorber film 112, a resist film on a transfer target is exposed to EUV light having a light quantity corresponding to a reflectance of about 40% at a portion 120 subjected to overlapping of twice exposure so that there is a possibility of sensitization of the resist film at portions that should not primarily be sensitized. Likewise, the resist film on the transfer target is exposed to EUV light having a light quantity corresponding to a reflectance of about 60% at a portion 121 subjected to overlapping of three-times exposure and is exposed to EUV light having a light quantity corresponding to a reflectance of about 80% at a portion 121 subjected to overlapping of four-times exposure so that there is a high possibility of sensitization of the resist film at portions that should not primarily be sensitized.

This invention has been made in view of the above circumstances and has an object to provide an EUV exposure mask that uses the theory of a halftone mask, wherein even if transfer patterns are transferred on a resist film of a transfer target with no gap therebetween such that a low-reflection portion of a transfer area and a leakage light area of a blind area overlap each other, the resist is not sensitized at an overlapping portion therebetween, and a mask blank for manufacturing such a mask.

Means for Solving the Problem

In order to achieve the above-mentioned object, the present inventor has considered providing an absorber layer in a blind area of a reflective mask, thereby causing a reflectance by the absorber layer in the blind area to be lower than a reflectance by a phase shift layer in a transfer pattern area.

Specifically, a reflective mask blank according to the present invention comprises a substrate, a multilayer reflective film formed on the substrate and having a structure in which a high refractive index layer and a low refractive index layer are alternately laminated, and an absorbing film stacked on the multilayer reflective film and adapted to absorb EUV exposure light. The absorbing film comprises a phase shift layer adapted to give a predetermined phase difference to the EUV exposure light having passed therethrough and reflected by the multilayer reflective film with respect to the EUV exposure light directly incident on and reflected by the multilayer reflective film, and an absorber layer stacked on the phase shift layer and adapted to absorb and attenuate the EUV exposure light passing therethrough, either alone or jointly with the phase shift layer.

In the reflective mask blank according to the present invention, the phase shift layer is preferably formed of a material composed mainly of tantalum. Further, the phase shift layer preferably comprises a semitransmissive layer and an antireflection layer while the semitransmissive layer is preferably formed of a material composed mainly of tantalum nitride. Moreover, the antireflection layer is preferably formed of a material composed mainly of tantalum oxide.

In the reflective mask blank according to the present invention, the absorber layer is preferably formed of a material having resistance to an etching gas for etching the phase shift layer. The absorber layer may be formed of a material composed mainly of tantalum nitride.

The reflective mask blank according to the present invention preferably comprises an etching stopper film between the phase shift layer and the absorber layer, the etching stopper film being formed of a material having resistance to an etching gas for etching the absorber layer. In this event, it is preferable that the etching stopper film is formed of a material composed mainly of chromium.

In the reflective mask blank according to the present invention, the absorbing film preferably comprises a low-reflection layer on the absorber layer. In this event, it is preferable that the low-reflection layer is formed of a material composed mainly of tantalum oxide.

The reflective mask blank according to the present invention preferably comprises a buffer film between the multilayer reflective film and the absorbing film. In this event, the buffer film may be formed of a material composed mainly of chromium, and alternatively, the buffer film may be formed of a material composed mainly of ruthenium.

A reflective mask according to the present invention is manufactured using the aforementioned reflective mask blank according to the present invention. The reflective mask comprises a transfer pattern area in which the phase shift layer is processed into a shape of a transfer pattern; and a blind area which is formed with a predetermined width around the transfer pattern area and in which the absorber layer is formed on the phase shift layer.

A reflective mask manufacturing method according to the present invention uses the aforementioned reflective mask blank according to the present invention. The reflective mask manufacturing method comprises the steps of:

dry-etching the absorber layer using a first resist film of a predetermined shape as a mask, thereby processing the absorber layer in a transfer pattern area into a shape of a transfer pattern;

dry-etching the phase shift layer using the first resist film as a mask, thereby processing the phase shift layer in the transfer pattern area into the shape of the transfer pattern; and dry-etching the absorber layer using a second resist film of a predetermined shape as a mask, thereby removing the absorber layer in the transfer pattern area and forming a blind area comprising the phase shift layer and the absorber layer around the transfer pattern area.

EFFECT OF THE INVENTION

In a reflective mask blank according to this invention, an absorber layer adapted to absorb and attenuate EUV exposure light is provided on a phase shift layer. Thus, when manufacturing a reflective mask from this reflective mask blank, the absorber layer can be provided in a blind area so that the reflectance in the blind area can be set lower than that by a phase shift layer in a transfer pattern area. Therefore, when exposure is carried out on a resist layer on a transfer target such that the blind areas overlap each other, it is possible to suppress sensitization of the resist layer in the blind area. Thus, it can be prevented that the resist is sensitized to affect transfer of a transfer pattern to the transfer target.

BEST MODE FOR CARRYING OUT THE INVENTION

Hereinbelow, the best mode for carrying out this invention will be described with reference to the drawings.

Figure 1:
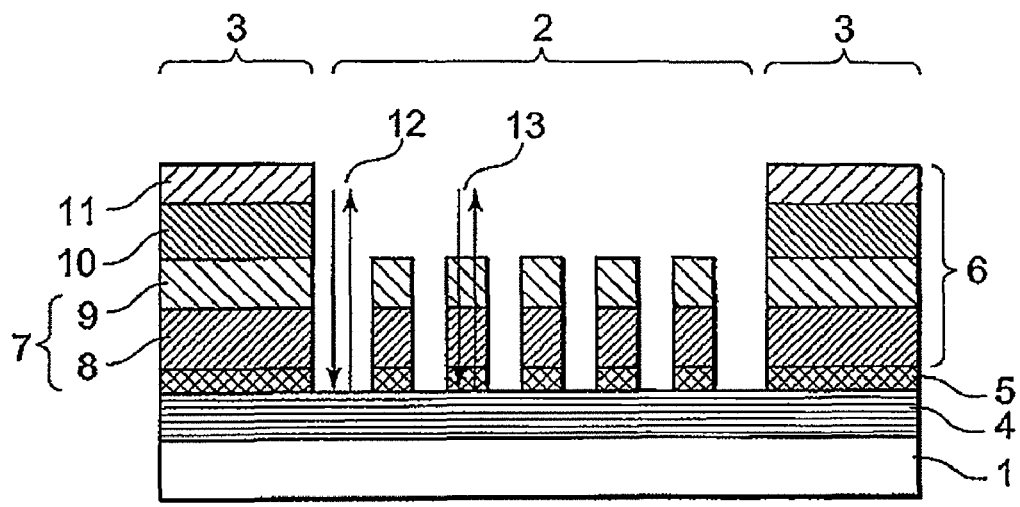
FIG. 1 is a diagram showing a cross-sectional structure of a reflective mask in an embodiment of this invention.

FIG. 1 is a diagram showing a cross-sectional structure of a reflective mask according to this embodiment.

In FIG. 1, there are, on a substrate 1, a transfer pattern area 2 where a transfer pattern is formed and a blind area 3 being an area which is provided to surround the transfer pattern area 2 and is formed with no transfer pattern. A multilayer reflective film 4 is formed on the entire surface of the substrate 1.

Figure 6A:
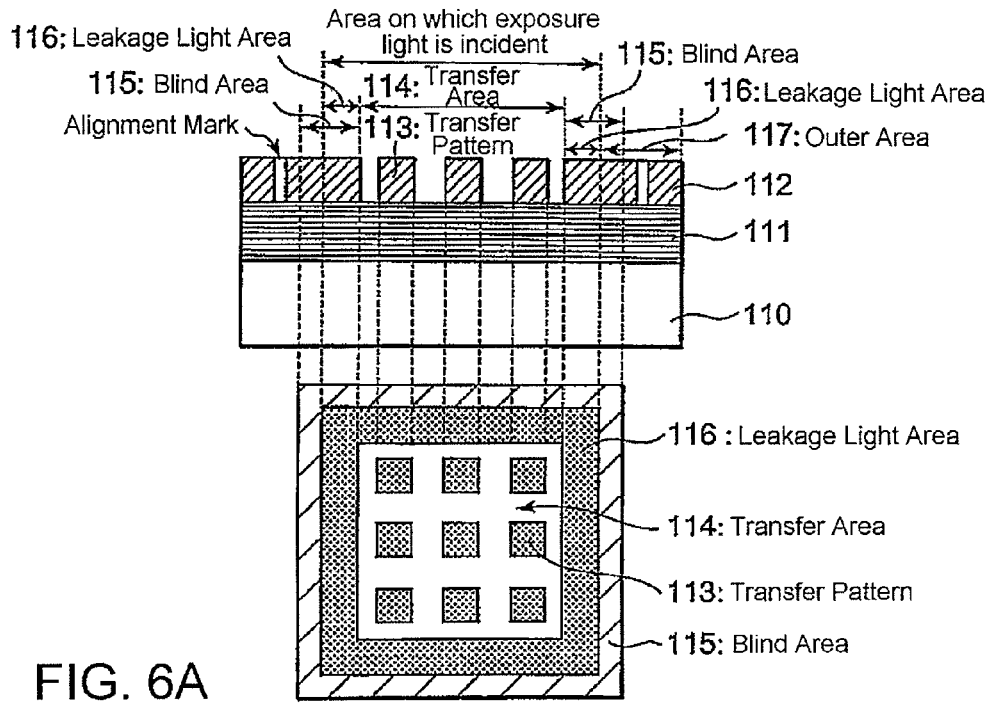
FIG. 6A is a diagram showing a cross-sectional structure and a planar structure of a related reflective mask.
Figure 6B:
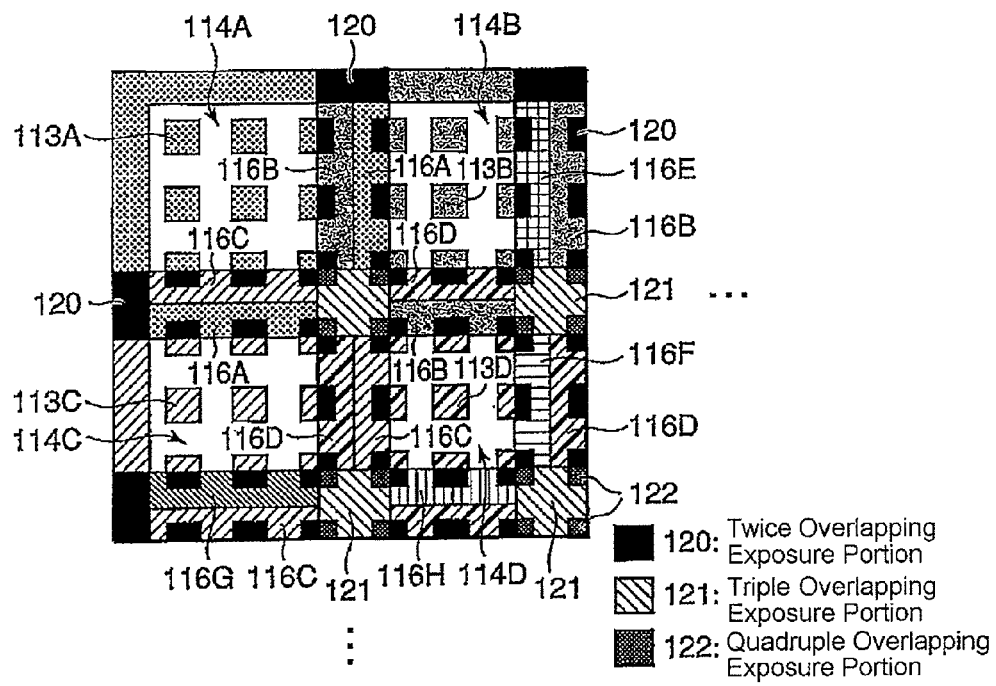
FIG. 6B is a diagram showing a planar structure of the related reflective mask.

In the blind area 3, a buffer film 5 and an absorbing film 6 are stacked in this order on the multilayer reflective film 4. The absorbing film 6 has a two-layer structure in which a phase shift layer 7 being a lower layer comprises a semitransmissive layer 8 and an antireflection layer 9 while an upper layer comprises an absorber layer 10 and a low-reflection layer 11. The low-reflection layer 11 may be provided according to need and thus is not necessarily provided. If the absorber layer 10 and the low-reflection layer 11 of the upper layer are formed at least in the leakage light area 116, which is shown in FIG. 6A, in the blind area 3, it is possible to suppress sensitization of an exposure-overlapping portion of a resist film on a transfer target. In this case, taking into account the positional accuracy of a mask stage of an exposure apparatus and the accuracy of a shielding plate serving to block irradiation of EUV exposure light onto the blind area 3, it is preferable to provide a margin for the width of the leakage light area 116. When taking into account the time for pattern writing/exposure on a resist film of a reflective mask blank in the manufacture of a reflective mask, it is preferable to form the absorber film 10 and the low-reflection layer 11 of the upper layer in the entire blind area 3 (both the leakage light area 116 and an outer area 117 in FIG. 6A).

In the transfer pattern area 2, the buffer film 5 and the phase shift layer 7 comprising the semitransmissive layer 8 and the antireflection layer 9 are formed in the shape of a transfer pattern on the multilayer reflective film 4 in this order. Nothing else is stacked on the multilayer reflective film 4 in the transfer pattern area 2.

The substrate 1 is required to have excellent smoothness and flatness and, as a material thereof, a glass substrate can be used. The glass substrate can be excellent in smoothness and flatness and is particularly suitable as a substrate for a mask. As a material of the glass substrate, there can be cited an amorphous glass (e.g. $SiO_2$—$TiO_2$-based glass or the like) having a low thermal expansion coefficient, a quartz glass, a crystallized glass precipitated with β-quartz solid solution, or the like.

The multilayer reflective film 4 formed on the substrate 1 has a structure in which a high refractive index material and a low refractive index material are alternately laminated, and is capable of reflecting light of a specific wavelength. For example, there can be cited a Mo/Si multilayer reflective film in which Mo and Si each having high reflectance for EUV light of 13 to 14 nm are alternately laminated by about 40 cycles. As examples of other multilayer reflective films for use in the region of the EUV light, there can be cited a Ru/Si cycle multilayer reflective film, a Mo/Be cycle multilayer reflective film, a Mo compound/Si compound cycle multilayer reflective film, a Si/Nb cycle multilayer reflective film, a Si/Mo/Ru cycle multilayer reflective film, a Si/Mo/Ru/Mo cycle multilayer reflective film, a Si/Ru/Mo/Ru cycle multilayer reflective film, and so on. The multilayer reflective film 4 can be formed by a well-known film forming method such as, for example, a magnetron sputtering method or an ion beam sputtering method.

The buffer film 5 is provided for the purpose of protecting the underlying multilayer reflective film 4 so as to prevent it from being damaged due to an etching process or the like in which the later-described upper layer is processed into the shape of a transfer pattern. Therefore, as a material of the buffer film 5, a selection is made of a substance that is not easily affected by the etching process of the overlying semitransmissive layer 8 while is removable by etching thereafter. For example, substances such as Cr, Al, Ru, Ta, their nitrides, $SiO_2$, $Si_3N_4$, and $Al_2O_3$ are preferable and a selection is properly made among them taking into account a material of the upper layer, an etching method, and so on. The thickness of the buffer film 5 is 100 nm or less and preferably 80 nm or less. The buffer film 5 can be formed using, likewise, the well-known film forming method such as the magnetron sputtering method or the ion beam sputtering method.

For example, when tantalum boron nitride (TaBN) is used as the later-described semitransmissive layer 8, it is preferable to use, as the buffer film 5, chromium nitride (CrN) or a ruthenium (Ru)-based material (Ru, RuNb, RuZr, RuMo, RuY, RuB, RuTi, RuLa, or the like) that is not easily etched by a chlorine-based gas being an etching gas for TaBN. If Ru or RuNb is used as the buffer film 5, since the Ru-based material is highly transparent for EUV light, use as a photomask is made possible without removing the buffer film 5. The buffer film 5 may be provided according to need and thus, depending on method and conditions for pattern formation in the absorber layer, the absorber layer may be provided directly on the reflective layer.

The absorbing film 6 is a film having a function of absorbing EUV light and, as described above, comprises the phase shift layer 7 composed of the semitransmissive layer 8 and the antireflection layer 9 and the absorber layer 10 formed on the phase shift layer 7. According to need, the low-reflection layer 11 may be provided on the absorber layer 10.

The phase shift layer 7 serves as the above-mentioned halftone mask in the transfer pattern area 2. For this purpose, assuming that the reflectance when EUV exposure light with its wavelength is directly incident on and reflected by the multilayer reflective film 4 (case indicated by 12 in FIG. 1) is given as a reference, the reflectance when the EUV exposure light is transmitted through the phase shift layer 7 and the buffer film 5 to be incident on and reflected by the multilayer reflective film 4 and is again transmitted through the buffer film 5 and the phase shift layer 7 (case indicated by 13 in FIG. 1) is preferably 5% to 20%. Further, the phase difference between reflected light through the phase shift layer 7 (reflected light in the case indicated by 13 in FIG. 1) and reflected light in the case of the direct incidence on the multilayer reflective film 4 (reflected light in the case indicated by 12 in FIG. 1) is preferably 175 to 185 degrees. Accordingly, materials and thickness of the phase shift layer 7 are designed so as to achieve the above-mentioned reflectance and phase difference. In the case where the Ru-based material is used as the buffer film 5 so that the buffer film is not removed also at portions where the phase shift layer 7 is removed, the buffer film 5 does not contribute to the phase difference and therefore it is preferable that the phase difference between the reflected light through the phase shift layer 7 and the reflected light in the case of the direct incidence on the multilayer reflective film 4 be adjusted to 175 to 185 degrees only by the phase shift layer 7.

The phase shift layer 7 is preferably formed of materials composed mainly of tantalum (Ta). The semitransmissive layer 8 is preferably formed of a material composed mainly of tantalum metal (Ta), tantalum boride (TaB), tantalum silicide (TaSi), or its nitride. Among them, it is particularly preferable that the semitransmissive layer 8 be formed of the material composed mainly of tantalum nitride (TaN) or tantalum boron nitride (TaBN). The antireflection layer 9 is preferably formed of a material composed mainly of tantalum oxide such as tantalum boron oxide (TaBO).

Normally, after manufacturing a reflective mask from a reflective mask blank for EUV, it is necessary to perform a pattern inspection for confirming that a transfer pattern is transferred to the mask with required accuracy. In a pattern inspection apparatus for performing this pattern inspection, not EUV light, but a light source with a longer wavelength (e.g. deep ultraviolet light of about 190 to 260 nm, visible light of a longer wavelength, or the like) is generally used as a light source of inspection light. The reason is such that an EUV light source apparatus is expensive and that, in the case of EUV light, since attenuation in the atmosphere is significant, the inside of a pattern inspection apparatus should be evacuated and thus the inspection apparatus becomes large-scale. In the pattern inspection apparatus, long-wavelength light is irradiated onto the reflective mask and the accuracy of a pattern is inspected based on the reflection contrast between the multilayer reflective film 4 and mask pattern portions (portions where the phase shift layer 7 is stacked). In this event, if the phase shift layer 7 comprises only the semitransmissive layer 8 of tantalum boron nitride (TaBN) or the like, there is a problem that the reflectance for the inspection light is high so that it is difficult to ensure the reflection contrast with respect to the multilayer reflective film 4. In view of this, the phase shift layer 7 has the structure in which the antireflection layer 9 composed mainly of tantalum oxide having low reflectance for the inspection light is laminated on the semitransmissive layer 8 composed mainly of tantalum metal or tantalum nitride having high absorptivity for EUV light.

The absorber layer 10 serves to absorb EUV exposure light in the blind area 3. Since the EUV exposure light is sufficiently absorbed by the absorber layer 10, it is possible to reduce sensitization of a resist film on a transfer target in the blind area. The absorber layer 10 is preferably formed of a material composed mainly of tantalum metal (Ta), tantalum boride (TaB), tantalum silicide (TaSi), or its nitride or a material composed mainly of chromium such as CrN or low-reflection Cr. Among them, it is particularly preferable that the absorber layer 10 be formed of the material composed mainly of tantalum nitride (TaN) or tantalum boron nitride (TaBN). The material of the absorber layer 10 preferably has resistance to an etching gas used in etching the phase shift layer 7 and thus it is preferable to select the material of the phase shift layer 7 and the material of the absorber layer 10 in such a combination.

The low-reflection layer 11 serves to ensure the reflection contrast with respect to the multilayer reflective film 4 for the inspection light of the pattern inspection apparatus in the blind area 3. The low-reflection layer 11 also serves to ensure the reflection contrast for long-wavelength light which is used when an exposure apparatus detects alignment marks (not illustrated) formed in the blind area 3. Jointly with the absorber layer 10, it is possible to reduce sensitization of the resist film on the transfer target in the blind area. The low-reflection layer 11 may be suitably provided according to need and, for example, if the material of the absorber layer 10 also carries out the function of the low-reflection layer 11, it is not necessary to provide the low-reflection layer. The low-reflection layer 11 is preferably formed of a material composed mainly of tantalum oxide such as tantalum boron oxide (TaBO) or preferably formed of silicon oxynitride (SiON), silicon oxide ($SiO_x$), molybdenum silicide nitride (MoSiN), molybdenum silicide oxynitride (MoSiON), or the like. Particularly, in terms of absorptivity for EUV light, the antireflection layer 9 is preferably formed of the material composed mainly of tantalum oxide such as tantalum boron oxide (TaBO).

In this invention, as an etching gas for a tantalum metal-based material, a tantalum nitride-based material, or the like which can be dry-etched by a chlorine-based gas, $Cl_2$, $SiCl_4$, HCl, $CCl_4$, or $CHCl_3$, for example, is applicable. In this invention, as an etching gas for a tantalum oxide-based material, a silicon oxide-based material, a molybdenum silicide-based material, or the like which should be dry-etched by a fluorine-based gas, $SF_6$, $CF_4$, $C_2F_6$, $CHF_3$, or $CHCl_3$, for example, is applicable. The fluorine-based gas may be added with He, $H_2$, Ar, $C_2H_4$, $O_2$, or the like, with a chlorine-based gas such as $Cl_2$ or $CH_2Cl_2$, or with the chlorine-based gas and He, $H_2$, Ar, $O_2H_4$, $O_2$, or the like.

Example 1

Hereinbelow, the embodiment of this invention will be described in further detail with reference to Examples. First, a manufacturing method of a reflective mask in this Example will be described with reference to the drawings.

FIGS. 2A to 2C and FIGS. 3A and 3B are diagrams showing cross-sectional structures of manufacturing processes of the reflective mask according to this Example.

Figure 2A:
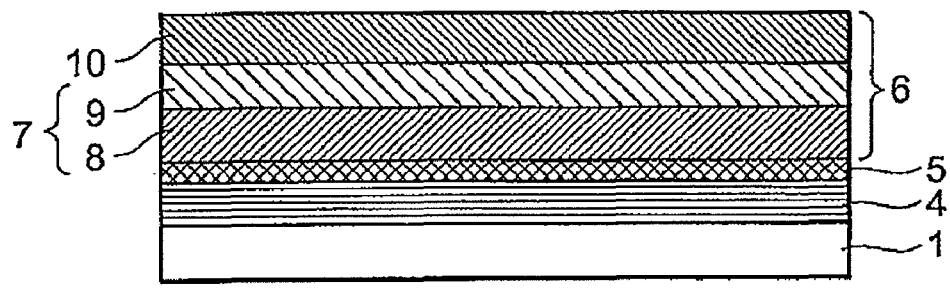
FIG. 2A is a cross-sectional structure of a reflective mask blank in Example 1 of this invention.

As shown in FIG. 2A, a reflective mask blank was manufactured. First, as a substrate 1, there was prepared a low-expansion $SiO_2$—$TiO_2$-based glass substrate having an external shape of 152 mm square with a thickness of 6.3 mm.

Then, an alternately laminated film of Mo and Si suitable as reflective films in the region of a wavelength 13 to 14 nm being a wavelength of EUV light was formed as a multilayer reflective film 4 on the substrate 1. The film formation was carried out using an ion beam sputtering apparatus. A Si target was first used to form a Si film to 4.2 nm thick, then a Mo target was used to form a Mo film to 2.8 nm thick and, given that this forms one cycle, Si and Mo films were laminated by 40 cycles and, finally, a Si film was formed to 4 nm thick. The total film thickness was 284 nm.

Then, a buffer film 5 of chromium nitride (CrN:N=10 at %) was formed on the multilayer reflective film 4. The film formation was carried out using a DC magnetron sputtering apparatus and the film thickness was set to 10 nm.

Then, a phase shift layer 7 being a lower layer of an absorbing film 6 was formed on the buffer film 5. As described before, the phase shift layer 7 comprises a semitransmissive layer 8 and an antireflection layer 9. First, as the semitransmissive layer 8, a film (TaN film) composed mainly of Ta and containing N was formed to 28 nm thick. A film forming method was such that, using a Ta target, the film was formed by DC magnetron sputtering using a mixed gas of argon gas (Ar) and nitrogen gas ($N_2$). The composition of the film was Ta:N=70:30.

Then, on the semitransmissive layer 8, a film (TaO film) composed mainly of Ta and containing O was formed to 14 nm thick as the antireflection layer 9. A film forming method was such that, using a Ta target, the film was formed by DC magnetron sputtering using a mixed gas of argon gas (Ar) and oxygen gas ($O_2$). The composition of the film was Ta:O=30:70.

Then, on the antireflection layer 9, a film (TaN film) composed mainly of Ta and containing N was formed to 40 nm thick as an absorber layer 10. A film forming method was such that, using a Ta target, the film was formed by DC magnetron sputtering using a mixed gas of argon gas (Ar) and nitrogen gas ($N_2$). The composition of the film was Ta:N=70:30.

In the manner described above, the reflective mask blank of this Example was obtained. In this Example, there was shown an example with no low-reflection layer 11.

Figure 2B:
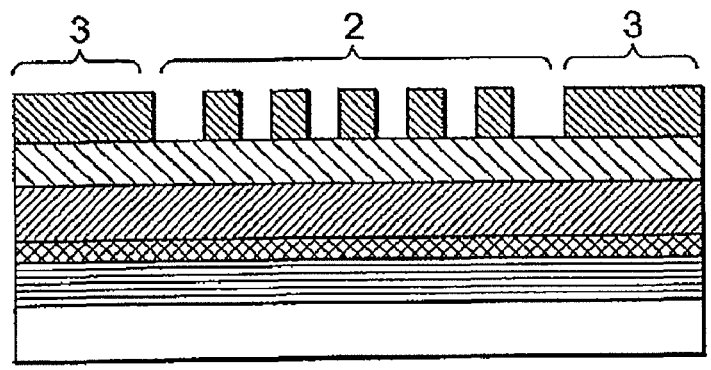
FIG. 2B is a diagram showing a manufacturing process of a reflective mask in Example 1 of this invention.

Then, as shown in FIG. 2B, the TaN film being the absorber layer 10 was processed into a transfer pattern in a transfer pattern area 2. The transfer pattern was a pattern for design rule half-pitch (hp) 45 nm DRAM.

First, an EB resist was coated on the absorber layer 10 of the reflective mask blank and a predetermined resist pattern was formed by EB writing and development (not illustrated). Then, using the resist pattern as a mask, the TaN film being the absorber layer 10 was dry-etched using a chlorine-based gas ($Cl_2$), thereby processing the absorber layer 10 into a predetermined pattern.

Figure 2C:
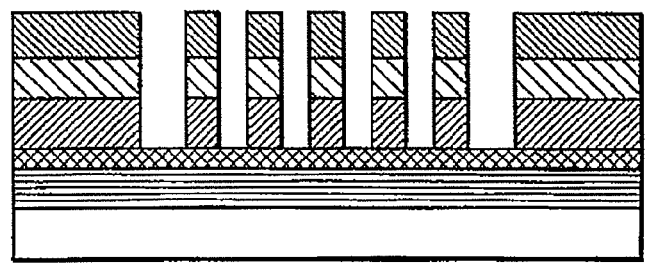
FIG. 2C is a diagram showing a manufacturing process of the reflective mask in Example 1 of this invention.

Then, as shown in FIG. 2C, using the resist pattern as a mask, the antireflection layer 9 and the semitransmissive layer 8 were etched in this order in the same manner as the absorber layer 10. The etching of the antireflection layer 9 being the TaO film was carried out by dry etching using a fluorine-based gas ($CF_4$), while the etching of the semitransmissive layer 8 being the TaN film was carried out by dry etching using a chlorine-based gas ($Cl_2$).

Figure 3A:
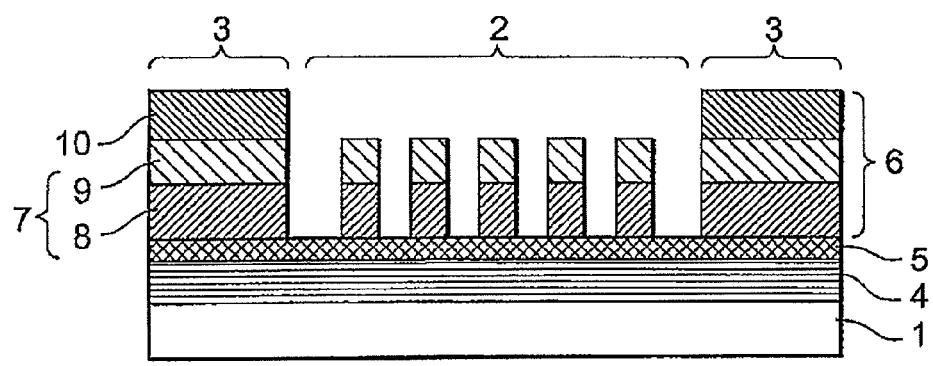
FIG. 3A is a diagram showing a manufacturing process of the reflective mask in Example 1 of this invention.

Then, as shown in FIG. 3A, after removing the resist pattern used for processing the absorber layer 10 and so on, an EB resist was coated again and a resist film was formed only on the absorber layer 10 in a blind area 3 by EB writing and development (not illustrated). Using this resist film as a mask, the absorber layer 10 was etched in the transfer pattern area 2. The etching of the absorber layer 10 being the TaN film was carried out by dry etching using a chlorine-based gas ($Cl_2$).

Figure 3B:
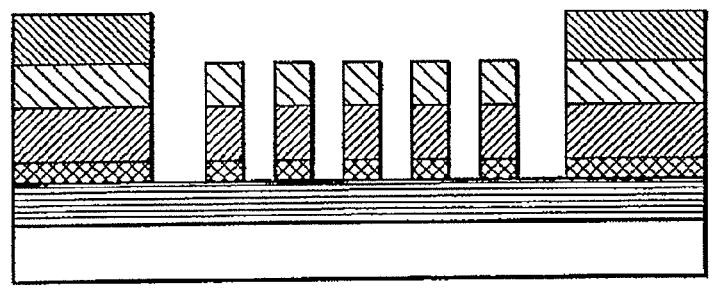
FIG. 3B is a diagram showing a manufacturing process of the reflective mask in Example 1 of this invention.

Then, as shown in FIG. 3B, using the antireflection layer 9 in the transfer pattern area 2 as a mask, the buffer film 5 being the CrN film was dry-etched using a mixed gas of chlorine and oxygen (mixing ratio was 4:1 by volume ratio). After the etching, the resist film was removed, thereby manufacturing a reflective mask according to this Example.

In the reflective mask manufactured as described above, the absorber layer 10 is provided in the blind area 3 so that the reflectance in the blind area 3 is set lower than that by the phase shift layer 7 in the transfer pattern area 2. Therefore, even if exposure is carried out a plurality of times using this reflective mask by shifting the position with the blind area 3 partially overlapping each other on a single transfer target formed with a resist film, it is possible to suppress sensitization of the resist film in the blind area 3.

Since the reflective mask blank has the structure in which, as shown in FIG. 2A, the absorber layer 10 is stacked on the phase shift layer 7 to form the absorbing film 6, it is possible to obtain the reflective mask having the above-mentioned effect.

Example 2

Hereinbelow, as Example 2, there is shown a case where, in Example 1, the semitransmissive layer 8 was, instead of the TaN film, a film (TaBN film) composed mainly of Ta and containing B and N, the antireflection layer 9 was, instead of the TaO film, a film (TaBO film) composed mainly of Ta and containing B and O, and the absorber layer 10 was, instead of the TaN film, a film (TaBN film) composed mainly of Ta and containing B and N. The other structure was the same as in Example 1.

The TaBN film forming the semitransmissive film 8 was formed on a buffer film 5 by the DC magnetron sputtering method using a sintered body target containing tantalum and boron and using an Ar gas added with 40% nitrogen. The film thickness was set to 30 nm as a thickness capable of semi-transmitting EUV exposure light. The composition ratio of the formed TaBN film was such that Ta:B:N=60:10:30.

The TaBO film forming the antireflection layer 9 was formed to 14 nm thick on the semitransmissive film 8 by the DC magnetron sputtering method using a target containing tantalum and boron and using an Ar gas added with 25% oxygen. The composition ratio of the formed TaBO film was such that Ta:B:O=30:10:60.

The TaBN film forming the absorber layer 10 was formed on the antireflection layer 9 by the DC magnetron sputtering method using a sintered body target containing tantalum and boron and using an Ar gas added with 40% nitrogen. The film thickness was set to 40 nm as a thickness capable of sufficiently absorbing EUV exposure light. The composition ratio of the formed TaBN film was such that Ta:B:N=60:10:30.

The other structure was the same as in Example 1 so that it was possible to obtain a reflective mask blank having the structure similar to FIG. 2A, wherein a multilayer reflective film 4 in the form of a Mo/Si multilayer film, the buffer film 5 of chromium nitride, the semitransmissive layer 8 in the form of the TaBN film, the antireflection layer 9 in the form of the TaBO film, and the absorber layer 10 in the form of the TaBN film were stacked in this order on a substrate 1 in the form of a glass substrate.

By processing the above-mentioned reflective mask blank by the same methods as in Example 1, it was possible to obtain a reflective mask shown in FIG. 3B. The TaBN films used as the semitransmissive film 8 and the absorber layer 10 in this Example were etched by the same methods for the TaN films used as the same layers in Example 1. The TaBO film used as the antireflection layer 9 in this Example was etched by the same method for the TaO film used as the same layer in Example 1.

Also in this reflective mask, the absorber layer 10 is provided in the blind area 3 so that the reflectance in the blind area 3 is set lower than that by the phase shift layer 7 in the transfer pattern area 2. Therefore, even if exposure is carried out a plurality of times using this reflective mask by shifting the position with the blind area 3 partially overlapping each other on a single transfer target formed with a resist film, it is possible to suppress sensitization of the resist film in the blind area 3. Since the reflective mask blank has the structure in which the absorber layer 10 is stacked on the phase shift layer 7, it is possible to obtain the reflective mask having the above-mentioned effect.

Example 3

Hereinbelow, as Example 3, there is shown a case where, in Example 1, the semitransmissive layer 8 was, instead of the TaN film, a film (TaB film) composed mainly of Ta and containing B, the antireflection layer 9 was, instead of the TaO film, a film (TaBO film) composed mainly of Ta and containing B and O, and the absorber layer 10 was, instead of the TaN film, a film (TaB film) composed mainly of Ta and containing B. The other structure was the same as in Example 1.

The TaB film forming the semitransmissive film 8 was formed on a buffer film 5 by the DC magnetron sputtering method using a sintered body target containing tantalum and boron and using an Ar gas. The film thickness was set to 28 nm as a thickness capable of semitransmitting EUV exposure light. The composition ratio of the formed TaBN film was such that Ta:B=80:20.

The TaBO film forming the antireflection layer 9 was formed to 14 nm thick on the semitransmissive film 8 by the DC magnetron sputtering method using a target containing tantalum and boron and using an Ar gas added with 25% oxygen. The composition ratio of the formed TaBO film was such that Ta:B:O=30:10:60.

The TaB film forming the absorber layer 10 was formed on the antireflection layer 9 by the DC magnetron sputtering method using a sintered body target containing tantalum and boron and using an Ar gas. The film thickness was set to 40 nm as a thickness capable of sufficiently absorbing EUV exposure light. The composition ratio of the formed TaB film was such that Ta:B=80:20.

The other structure was the same as in Example 1 so that it was possible to obtain a reflective mask blank having the structure similar to FIG. 2A, wherein a multilayer reflective film 4 in the form of a Mo/Si multilayer film, the buffer film 5 of chromium nitride, the semitransmissive layer 8 in the form of the TaB film, the antireflection layer 9 in the form of the TaBO film, and the absorber layer 10 in the form of the TaB film were stacked in this order on a substrate 1 in the form of a glass substrate.

By processing the above-mentioned reflective mask blank by the same methods as in Example 1, it was possible to obtain a reflective mask shown in FIG. 3B. The TaB films used as the semitransmissive film 8 and the absorber layer 10 in this Example were etched by the same methods for the TaN films used as the same layers in Example 1. The TaBO film used as the antireflection layer 9 in this Example was etched by the same method for the TaO film used as the same layer in Example 1.

Also in this reflective mask, the absorber layer 10 is provided in the blind area 3 so that the reflectance in the blind area 3 is set lower than that by the phase shift layer 7 in the transfer pattern area 2. Therefore, even if exposure is carried out a plurality of times using this reflective mask by shifting the position with the blind area 3 partially overlapping each other on a single transfer target formed with a resist film, it is possible to suppress sensitization of the resist film in the blind area 3. Since the reflective mask blank has the structure in which the absorber layer 10 is stacked on the phase shift layer 7, it is possible to obtain the reflective mask having the above-mentioned effect.

Example 4

As Example 4, there is shown a case where an etching stopper film 14 was additionally formed between the antireflection layer 9 and the absorber layer 10 in the structure of the reflective mask in Example 1. The etching stopper film 14 is provided for protecting the underlying antireflection layer 9 so as to prevent it from being damaged in the process of etching the absorber layer 10 in the transfer pattern area 2 into the shape of the transfer pattern as described with reference to FIG. 2B in Example 1 and thus should be made of a material having resistance to the etching gas used in etching the absorber layer 10. For example, in Example 1, the absorber layer 10 was formed by the TaN film and the processing of the TaN film was carried out by dry etching using chlorine, and therefore, the etching stopper film 14 is preferably made of a material composed mainly of chromium such as chromium nitride (CrN) having resistance to etching by chlorine.

Hereinbelow, a description will be given of an example in which a CrN film was inserted as the etching stopper film 14 in the structure of Example 1. First, layers from a multilayer reflective film 4 to an antireflection film 9 were formed on a glass substrate 1 by the methods described in Example 1 and then a CrN film was formed to 5 nm thick on the antireflection film 9 by a DC magnetron sputtering apparatus. Subsequently, an absorber layer 10 was formed on the etching stopper film 14 by the same method as in Example 1.

Figure 4A:
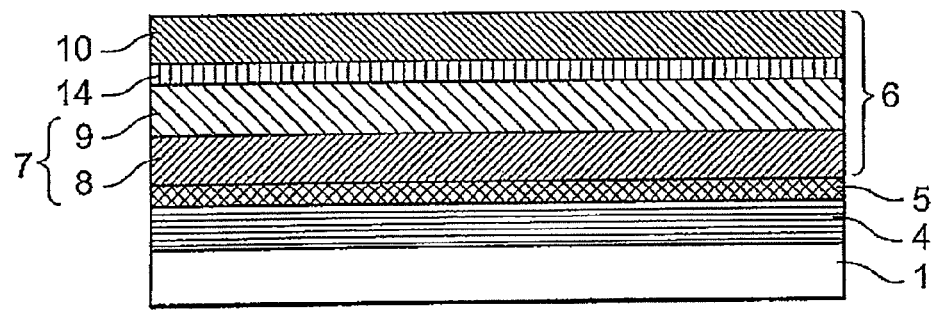
FIG. 4A is a diagram showing a cross-sectional structure of a reflective mask blank in Example 4 of this invention.

As a result, as seen from a cross-sectional view shown in FIG. 4A, there was obtained a reflective mask blank in which the multilayer reflective film 4 in the form of a Mo/Si multilayer film, the buffer film 5 of chromium nitride, the semi-transmissive layer 8 in the form of a TaN film, the antireflection layer 9 in the form of a TaO film, the etching stopper film 14 in the form of the CrN film, and the absorber layer 10 in the form of a TaN film were stacked in this order on the substrate 1 in the form of the glass substrate.

Then, the absorber layer 11 was processed into the shape of a transfer pattern in the transfer pattern area 2 by the same method as in Example 1. In this event, since the etching stopper film 14 was provided, it was possible to prevent the antireflection film 9 from being damaged due to an etching gas for the absorber layer 11.

Subsequently, using the absorber layer 10 as a mask, the etching stopper film 14 being the CrN film was dry-etched using a mixed gas of chlorine and oxygen (mixing ratio was 4:1 by volume ratio).

Figure 4B:
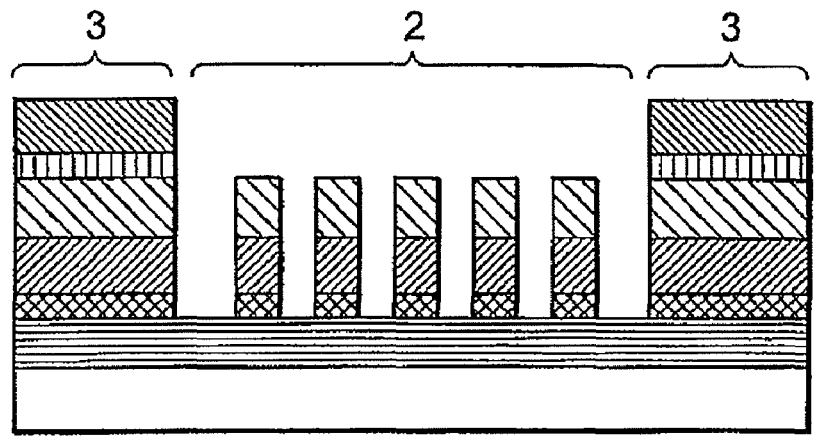
FIG. 4B is a diagram showing a cross-sectional structure of a reflective mask in Example 4 of this invention.

Thereafter, the respective layers were processed by the same methods as in Example 1, thereby obtaining a reflective mask shown in FIG. 4B.

Also in this reflective mask, the absorber layer 10 is provided in the blind area 3 so that the reflectance in the blind area 3 is set lower than that by the phase shift layer 7 in the transfer pattern area 2. Therefore, even if exposure is carried out a plurality of times using this reflective mask by shifting the position with the blind area 3 partially overlapping each other on a single transfer target formed with a resist film, it is possible to suppress sensitization of the resist film in the blind area 3.

Further, since the etching stopper film 14 is formed between the antireflection layer 9 and the absorber layer 10, it is possible to prevent damage to the antireflection film 9 due to the etchant for the absorber layer 10.

Since the reflective mask blank has the structure in which the absorber layer 10 is stacked on the phase shift layer 7, it is possible to obtain the reflective mask having the above-mentioned effect.

Example 5

As Example 5, there is shown a case where a low-reflection layer 11 was additionally formed on the absorber layer 10 in the structure of the reflective mask in Example 4. Hereinbelow, a description will be given of an example in which a low-reflection layer 11 in the form of a TaO film was formed on the absorber layer 10 in the structure of Example 4. First, layers from a multilayer reflective film 4 to an etching stopper film 14 were formed on a glass substrate 1 by the methods described in Example 4 and then a TaN film was formed to 28 nm thick as an absorber layer 10 on the etching stopper film 14 by a DC magnetron sputtering apparatus. Subsequently, a TaO film was formed to 14 nm thick as a low-reflection layer 11 on the absorber layer 10 by the DC magnetron sputtering apparatus.

Figure 5A:
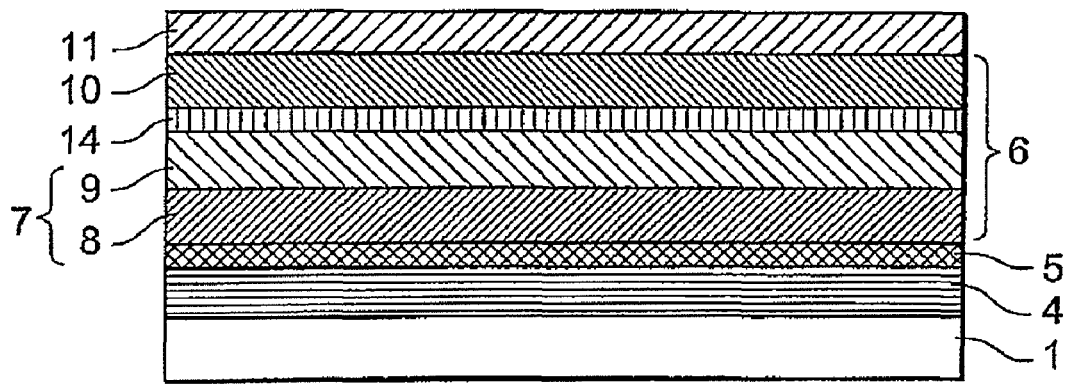
FIG. 5A is a diagram showing a cross-sectional structure of a reflective mask blank in Example 5 of this invention.

As a result, as seen from a cross-sectional view shown in FIG. 5A, there was obtained a reflective mask blank in which the multilayer reflective film 4 in the form of a Mo/Si multilayer film, the buffer film 5 of chromium nitride, the semi-transmissive layer 8 in the form of a TaN film, the antireflection layer 9 in the form of a TaO film, the etching stopper film 14 in the form of a CrN film, the absorber layer 10 in the form of the TaN film, and the low-reflection film 11 in the form of the TaO film were stacked in this order on the substrate 1 in the form of the glass substrate.

Then, in the transfer pattern area 2, the TaO film being the low-reflection layer 11 was processed into a transfer pattern. The transfer pattern was a pattern for design rule half-pitch (hp) 45 nm DRAM.

First, an EB resist was coated on the low-reflection layer 11 of the reflective mask blank and a predetermined resist pattern was formed by EB writing and development. Then, using the resist pattern as a mask, the TaO film being the low-reflection layer 11 was dry-etched using a fluorine-based gas ($CF_4$), thereby processing the low-reflection layer 11 into a predetermined pattern. Then, using the low-reflection layer 11 as a mask, the TaO film being the absorber layer 10 was dry-etched using a chlorine-based gas ($Cl_2$), thereby processing the absorber layer 10 into a predetermined pattern.

Then, using the low-reflection layer 11 and the absorber layer 10 as a mask, the etching stopper film 14 being the CrN film was dry-etched using a mixed gas of chlorine and oxygen (mixing ratio was 4:1 by volume ratio). Subsequently, using the etching stopper film 14 and so on as a mask, the antireflection layer 9 and the semitransmissive layer 8 were etched in this order. The etching of the antireflection layer 9 being the TaO film was carried out by dry etching using a fluorine-based gas ($CF_4$), while the etching of the semitransmissive layer 8 being the TaN film was carried out by dry etching using a chlorine-based gas ($Cl_2$).

Then, after removing the resist pattern used for processing the low-reflection layer 11 and so on, an EB resist was coated again and a resist film was formed only on the low-reflection layer 11 in the blind area 3 by EB writing and development. Using this resist film as a mask, the low-reflection layer 11 and the absorber layer 10 were etched in the transfer pattern area 2. The etching of the low-reflection layer 11 being the TaO film and the etching of the absorber layer 10 being the TaN film were both carried out by dry etching using a fluorine-based gas ($CF_4$). In this event, since the etching stopper film 14 was provided, it was possible to prevent the antireflection layer 9 being the TaO film from being damaged due to the fluorine-based gas ($CF_4$).

Figure 5B:
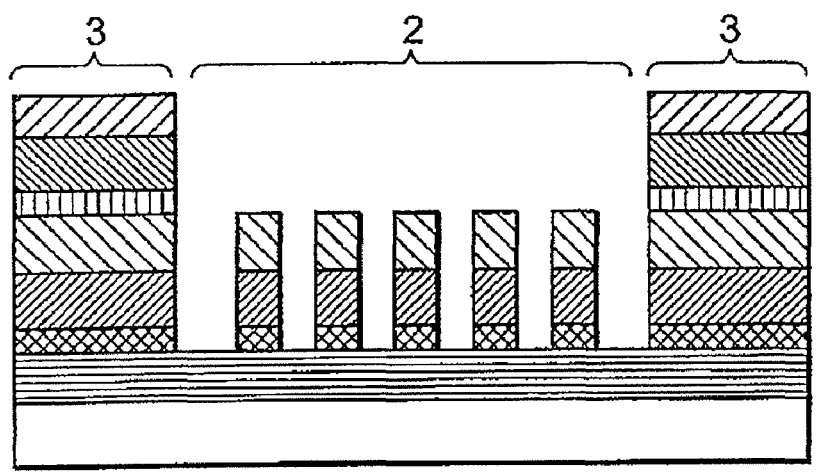
FIG. 5B is a diagram showing a cross-sectional structure of a reflective mask in Example 5 of this invention.

Then, using the antireflection layer 9 and the semitransmissive layer 8 in the transfer pattern area 2 as a mask, the buffer film 5 being the CrN film was dry-etched using a mixed gas of chlorine and oxygen (mixing ratio was 4:1 by volume ratio), thereby exposing a surface of the multilayer reflective film 4 at pattern portions. In this event, the etching stopper film 14 being the same CrN film was simultaneously dry-etched, thereby exposing a surface of the antireflection layer 9. After the etching of them, the resist film was removed, thereby manufacturing a reflective mask according to this Example shown in FIG. 5B.

Also in this reflective mask, the absorber layer 10 is provided in the blind area 3 so that the reflectance in the blind area 3 is set lower than that by the phase shift layer 7 in the transfer pattern area 2. Therefore, even if exposure is carried out a plurality of times using this reflective mask by shifting the position with the blind area 3 partially overlapping each other on a single transfer target formed with a resist film, it is possible to suppress sensitization of the resist film in the blind area 3.

Further, since the etching stopper film 14 is formed between the antireflection layer 9 and the absorber layer 10, it is possible to prevent the antireflection film 9 from being damaged during dry etching of the absorber layer 10 using the fluorine-based gas ($CF_4$).

Since the reflective mask blank has the structure in which the absorber layer 10 and the low-reflection film 11 are stacked on the phase shift layer 7, it is possible to sufficiently obtain the optical contrast between the multilayer reflective film 4 and the low-reflection layer for inspection light of a pattern inspection apparatus, thereby enabling a pattern inspection with higher accuracy.

Example 6

Hereinbelow, as Example 6, there is shown a case where, in Example 1, the buffer film 5 was a RuNb film instead of the CrN film and the absorber layer 10 was a CrN film instead of the TaN film. The other structure was the same as in Example 1.

The RuNb film forming the buffer 8 was formed to 2.5 nm thick on a multilayer reflective film 4 by the DC magnetron sputtering method using a sintered body target containing ruthenium and niobium.

The CrN film forming the absorber layer 10 was formed on an antireflection layer 9 by the DC magnetron sputtering method using a Cr target and using an Ar gas added with nitrogen. The film thickness was set to 52 nm as a thickness capable of sufficiently absorbing EUV exposure light. The composition ratio of the formed CrN film was such that Cr:N=90:10.

The other structure was the same as in Example 1 so that it was possible to obtain a reflective mask blank having the structure similar to FIG. 2A, wherein the multilayer reflective film 4 in the form of a Mo/Si multilayer film, the buffer film 5 of RuNb, a semitransmissive layer 8 in the form of a TaBN film, the antireflection layer 9 in the form of a TaBO film, and the absorber layer 10 in the form of the CrN film were stacked in this order on a substrate 1 in the form of a glass substrate.

Then, as shown in FIG. 2B, the TaN film being the absorber layer 10 was processed into a transfer pattern in the transfer pattern area 2. Like in Example 1, the transfer pattern was a pattern for design rule half-pitch (hp) 45 nm DRAM.

First, an EB resist was coated on the absorber layer 10 of the reflective mask blank and a predetermined resist pattern was formed by EB writing and development (not illustrated). Then, using the resist pattern as a mask, the CrN film being the absorber layer 10 was dry-etched using a mixed gas of chlorine and oxygen (mixing ratio was 4:1 by volume ratio), thereby processing the absorber layer 10 into a predetermined pattern.

Then, as shown in FIG. 2C, using the resist pattern as a mask, the antireflection layer 9 and the semitransmissive layer 8 were etched in this order in the same manner as the absorber layer 10. The etching of the antireflection layer 9 being the TaO film was carried out by dry etching using a fluorine-based gas ($CF_4$), while the etching of the semitransmissive layer 8 being the TaN film was carried out by dry etching using a chlorine-based gas ($Cl_2$).

Then, as shown in FIG. 3A, after removing the resist pattern used for processing the absorber layer 10 and so on, an EB resist was coated again and a resist film was formed only on the absorber layer 10 in the blind area 3 by EB writing and development (not illustrated). Using this resist film as a mask, the absorber layer 10 was etched in the transfer pattern area 2. The etching of the absorber layer 10 being the CrN film was carried out by dry etching using a mixed gas of chlorine and oxygen (mixing ratio was 4:1 by volume ratio). After the etching, the resist film was removed, thereby manufacturing a reflective mask according to this Example. In the case of this Example 6, the buffer film 5 has high transmittance for EUV exposure light and, therefore, use as a reflective mask is made in the state of FIG. 3A where the buffer film 5 remains as it is without carrying out dry etching for pattern transfer.

Also in this reflective mask, the absorber layer 10 is provided in the blind area 3 so that the reflectance in the blind area 3 is set lower than that by the phase shift layer 7 in the transfer pattern area 2. Therefore, even if exposure is carried out a plurality of times using this reflective mask by shifting the position with the blind area 3 partially overlapping each other on a single transfer target formed with a resist film, it is possible to suppress sensitization of the resist film in the blind area 3. Since the reflective mask blank has the structure in which the absorber layer 10 is stacked on the phase shift layer 7, it is possible to obtain the reflective mask having the above-mentioned effect.

In this Example 6, no low-reflection layer 11 is provided. However, if a low-reflection layer 11 of a Cr-based material (CrON, CrO, CrOC, CrOCN) is provided on the absorber layer 10, the reflection contrast of alignment marks in the blind area becomes high, which is thus preferable when performing optical alignment. Further, the absorber layer 10 and the low-reflection layer 11 can be formed using the same Cr target and can be etched at a time by the same etching gas using a resist pattern as a mask, which is particularly preferable in terms of production efficiency and production stability.

This invention is not limited to the above-mentioned embodiment and can be carried out with appropriate changes thereto. For example, in the above-mentioned embodiment, there are shown the Examples having no low-reflection layer 11 except Example 5, but in each Example, if a low-reflection layer 11 is provided on the absorber layer 10, the reflection contrast of alignment marks in the blind area becomes high, which is thus preferable when performing optical alignment. The low-reflection layer 11 is, for example, preferably formed of a material composed mainly of tantalum oxide such as tantalum boron oxide (TaBO) or preferably formed of silicon oxynitride (SiON), silicon dioxide ($SiO_2$), molybdenum silicide nitride (MoSiN), molybdenum silicide oxynitride (MoSiON), or the like.

Further, if the low-reflection layer 11 is formed so as to overlie the absorber layer 10, since an object to be dry-etched using a resist pattern as a mask is the low-reflection layer 11 which is thin, the resist pattern can be transferred to the low-reflection layer 11 with high accuracy. Then, the pattern can be transferred by etching the absorber layer 10 and so on using this low-reflection layer 11 as a mask and therefore it is possible to manufacture a mask with higher accuracy, which is thus preferable.

There are shown the Examples using the CrN film as the material of the buffer film 5, but in each Example, Ru may be used instead of CrN. In this case, since Ru is highly transparent for EUV light, use as a reflective mask is made possible without removing the buffer film 5. The buffer film 5 may be provided according to need and thus, depending on method and conditions for pattern formation in the absorber layer, the absorber layer may be provided directly on the reflective layer. Further, in the case of providing a Ru layer for the purpose of leaving it as a layer for protecting a surface of the multilayer reflective film 4 after manufacturing a reflective mask, in order to prevent a surface of the Ru layer from being roughened during etching of the semitransmissive layer 8 overlying the Ru layer, a CrN layer may be provided so as to overlie the Ru layer, thereby forming the buffer layer 5 by these two layers.

In Example 3, there is shown the structure in which the etching stopper film 14 is added to the reflective mask blank and the reflective mask of Example 1. However, the etching stopper film 14 may also be added to the reflective mask blank and the reflective mask of Example 2. Methods of forming and processing the etching stopper film 14 are the same as those described in Example 3.

The materials, sizes, processing sequences, and so on in the above-mentioned embodiment are only examples and this invention can be carried out by changing them in various ways within a range capable of exhibiting the effect of this invention. Other than that, this invention can be carried out with appropriate changes within a range not departing from the object of this invention.

Although the description has been given of the semitransmissive layer, this invention can also be carried out for suppressing the reflectance in a blind area for a normal absorbing layer.

The invention claimed is:

1. A reflective mask blank, comprising:
    a substrate,
    a multilayer reflective film formed on the substrate and having a structure in which a high refractive index layer and a low refractive index layer are alternately laminated, and
    an absorbing film stacked on the multilayer reflective film and adapted to absorb EUV exposure light,
    wherein the absorbing film comprises a phase shift layer adapted to give a predetermined phase difference to the EUV exposure light having passed therethrough and reflected by the multilayer reflective film with respect to the EUV exposure light directly incident on and reflected by the multilayer reflective film, and an absorber layer stacked on the phase shift layer and adapted to absorb and attenuate the EUV exposure light passing therethrough, either alone or jointly with the phase shift layer,
    wherein the phase shift layer and the absorbing layer are formed at least throughout an entire surface of a transfer pattern area and a blind area on the multilayer reflective film, and
    wherein the transfer pattern area comprises a transfer pattern while the blind area is provided to surround the transfer pattern area and to comprise no transfer pattern, when manufacturing a reflective mask from the reflective mask blank.

2. The reflective mask blank according to claim 1, wherein the phase shift layer is formed of a material composed mainly of tantalum.

3. The reflective mask blank according to claim 1, wherein the phase shift layer comprises a semitransmissive layer and an antireflection layer.

4. The reflective mask blank according to claim 3, wherein the semitransmissive layer is formed of a material composed mainly of tantalum nitride.

5. The reflective mask blank according to claim 3, wherein the antireflection layer is formed of a material composed mainly of tantalum oxide.

6. The reflective mask blank according to claim 1, wherein the absorber layer is formed of a material having resistance to an etching gas for etching the phase shift layer.

7. The reflective mask blank according to claim 1, wherein the absorber layer is formed of a material composed mainly of tantalum nitride.

8. The reflective mask blank according to claim 1, comprising:
    an etching stopper film between the phase shift layer and the absorber layer, the etching stopper film being formed of a material having resistance to an etching gas for etching the absorber layer.

9. The reflective mask blank according to claim 8, wherein the etching stopper film is formed of a material composed mainly of chromium.

10. The reflective mask blank according to claim 8, wherein the etching stopper film is formed of a material containing ruthenium.

11. The reflective mask blank according to claim 1, wherein the absorbing film comprises a low-reflection layer on the absorber layer.

12. The reflective mask blank according to claim 11, wherein the low-reflection layer is formed of a material composed mainly of tantalum oxide.

13. The reflective mask blank according to claim 1, comprising:
    a buffer film between the multilayer reflective film and the absorbing film.

14. The reflective mask blank according to claim 13, wherein the buffer film is formed of a material composed mainly of chromium.

15. The reflective mask blank according to claim 13, wherein the buffer film is formed of a material composed mainly of ruthenium.

16. A reflective mask manufactured using the reflective mask blank according to claim 1, comprising:
    a transfer pattern area in which the phase shift layer is processed into a shape of a transfer pattern; and
    a blind area which is formed with a predetermined width around the transfer pattern area and in which the absorber layer is formed on the phase shift layer.

17. The reflective mask according to claim 16, wherein the absorbing layer is not present on the phase shift layer throughout an entire surface of the transfer pattern area.

18. The reflective mask according to claim 16, wherein the absorber layer is provided in the blind area so that a reflectance in the blind area is set lower than a reflectance by the phase shift layer in the transfer pattern area.

19. A reflective mask manufacturing method using the reflective mask blank according to claim 1, comprising the steps of:
    dry-etching the absorber layer using a first resist film of a predetermined shape as a mask, thereby processing the absorber layer in a transfer pattern area into a shape of a transfer pattern;
    dry-etching the phase shift layer using the first resist film as a mask, thereby processing the phase shift layer in the transfer pattern area into the shape of the transfer pattern; and
    dry-etching the absorber layer using a second resist film of a predetermined shape as a mask, thereby removing the absorber layer in the transfer pattern area and forming a blind area comprising the phase shift layer and the absorber layer around the transfer pattern area.

20. The reflective mask blank according to claim 1, wherein the phase shift layer and the absorbing layer are formed at least throughout the entire surface of the transfer pattern area and the blind area to have substantially the same thickness.

21. The reflective mask blank according to claim 1, wherein the phase shift layer comprises a laminate structure of a lower layer and an upper layer;

the lower layer being formed of a material which contains tantalum and no oxygen;

the upper layer being formed of a material which contains tantalum and oxygen;

the absorber layer being formed of a material which contains tantalum and no oxygen.

22. A reflective mask manufacturing method using the reflective mask blank according to claim 1, comprising the steps of:

dry-etching the absorber layer using a first resist film of a predetermined shape as a mask, thereby processing the absorber layer in a transfer pattern area into a shape of a transfer pattern;

dry-etching the phase shift layer using the first resist film as a mask, thereby processing the phase shift layer in the transfer pattern area into the shape of the transfer pattern; and dry-etching the absorber layer using a second resist film of a predetermined shape as a mask, thereby removing the absorber layer in an entire region of the transfer pattern area, and forming a blind area comprising the phase shift layer and the absorber layer around the transfer pattern area.

23. The reflective mask blank according to claim 1, wherein the absorber layer is provided in the blind area so that a reflectance in the blind area is set lower than a reflectance by the phase shift layer in the transfer pattern area, when manufacturing the reflective mask from the reflective mask blank.

* * * * *